(12) United States Patent
Liou

(10) Patent No.: US 6,211,030 B1
(45) Date of Patent: Apr. 3, 2001

(54) METHOD FOR FABRICATING RESISTORS IN INTEGRATED CIRCUITS

(75) Inventor: Fu-Tai Liou, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/173,703

(22) Filed: Oct. 15, 1998

(30) Foreign Application Priority Data

Jul. 6, 1998 (TW) ................................................. 87110877

(51) Int. Cl.$^7$ ................................................. H01L 21/20
(52) U.S. Cl. ........................ 438/382; 438/381; 438/608; 438/475
(58) Field of Search ...................... 438/171, 190, 438/210, 238, 320, 330, 381, 382, 608, 720, 742, 475; 427/101; 338/22 R, 22 SD; 252/500, 506, 507, 518.1, 519.1, 519.12, 520.2, 520.22

(56) References Cited

U.S. PATENT DOCUMENTS

| | | | |
|---|---|---|---|
| 4,039,698 | | 8/1977 | Fraser et al. ............................ 427/34 |
| 4,725,810 | * | 2/1988 | Foroni et al. ......................... 338/226 |
| 5,281,845 | * | 1/1994 | Wang et al. .......................... 257/467 |
| 5,424,707 | * | 6/1995 | Ishikawa et al. ................. 338/22 SD |
| 5,712,200 | * | 1/1998 | Jiang .................................... 438/238 |
| 5,739,059 | * | 4/1998 | Chen et al. .......................... 438/238 |
| 5,821,150 | * | 10/1998 | Prall et al. ........................... 438/238 |
| 5,854,103 | * | 12/1998 | Liang ................................... 438/238 |
| 5,893,731 | * | 4/1999 | Lee et al. ............................. 438/238 |
| 5,909,617 | * | 6/1999 | Manning et al. .................... 438/238 |
| 5,981,329 | * | 11/1999 | Batra et al. .......................... 438/238 |

FOREIGN PATENT DOCUMENTS 0075874    4/1983   (EP) .
0 463 174 A1   1/1992   (EP) .
0 641 144 A1   3/1995   (EP) .

OTHER PUBLICATIONS

Keu Hong Kim, Eung Ju Oh, Jae Shi Choi; Electrical Conductivity of "Hydrogen–Reduced" Titanium Dioxide (Rutile); Journal of the Physics and Chemistry of Solids, 1984.
D.S. Ginley, R.P. Hellmer; Polysilicon Resistor Modification; Journal of the Electrochemical Society, Aug. 1987.

* cited by examiner

Primary Examiner—John F. Niebling
Assistant Examiner—Christopher Lattin
(74) Attorney, Agent, or Firm—Oppenheimer Wolff & Donnelly LLP

(57) ABSTRACT

A semiconductor fabrication method is provided for fabricating resistors in integrated circuits. This method allows the resistors to be formed with a wider range of resistance values, in contrast to the prior art in which polysilicon is used to form the resistors. In accordance with this method, the resistors are formed from refractory metal oxides. To provide only one specific resistive characteristic, one stage of hydrogen treatment is performed on a selected part of the refractory metal oxide layer where the resistor is to be formed. Through the hydrogen treatment, the selected part of the reactory metal oxide layer is converted into a semiconductive oxide or a conductive oxide to serve as the desired resistor. Moreover, when forming a plurality of resistors with various resistive characteristics, a number of stages of hydrogen treatment are performed successively on selected portions of the refractory metal oxide layer where the resistors to be formed in the integrated circuit are defined. These various stages of hydrogen treatment are performed respectively based on different sets of process parameters such that the conversion of the selected portions of the refractory metal oxide layer into conductive oxides can be controlled to the desired degrees so as to form the resistors with various resistive characteristics.

21 Claims, 3 Drawing Sheets

METHOD FOR FABRICATING RESISTORS IN INTEGRATED CIRCUITS

CROSS-REFERENCE TO RELATED APPLICATION

This application claims the priority benefit of Taiwan application serial no. 87110877, filed Jul. 6, 1998, the full disclosure of which is incorporated herein by reference.

BACKGROUND OF THE INVENTION

1. Field of the Invention

This invention relates to a semiconductor fabrication method, and more particularly, to a method of fabricating resistors in integrated circuits.

2. Description of Related Art

Resistors are the most often used components in all kinds of electrical and electronic circuits, including integrated circuits such as memory and logic devices. Conventionally, resistors in integrated circuits are made from lightly-doped polysilicon layers that are shaped into specific lengths and cross-sectional areas to provide the desired resistance values. Another conventional method of forming resistors in integrated circuits is to perform a thermal annealing process on a joined structure of a high-resistance conductive layer and a low-resistance conductive layer, such as an undoped polysilicon layer and a highly-doped polysilicon layer. This method also requires the conductive layers to be shaped into specific lengths and cross-sectional areas to provide the desired resistance values.

Patents that disclose methods of fabricating resistors in integrated circuits include the U.S. Pat. No. 5,316,978 entitled "Fabricating Resistors for Integrated Circuits", the U.S. Pat. No. 5,465,005 entitled "Polysilicon Resistor Structure Including Polysilicon Contact", and the U.S. Pat. No. 5,677,228 entitled "Method of Fabricating a Resistor in an Integrated Circuit", to name just a few.

One drawback to the above-mentioned methods, however, is that, since polysilicon is used to form the resistors, the method requires the use of an etching process to shape the polysilicon layers into specific lengths and cross-sectional areas to provide the desired resistance values. This makes the overall process quite complex and thus laborious to carry out. Still another drawback is that the use of polysilicon allows only a limited range of resistance values for the resultant resistors. This is because the resistance of a polysilicon-based resistor is largely dependent on the length and crosssectional area of the resistor. A high resistance therefore requires that the polysilicon layer be very long. Since a wafer is very small in size, the feasible range of resistance values for the resultant resistors is limited.

SUMMARY OF THE INVENTION

It is therefore an objective of the invention to provide a method of fabricating resistors in an integrated circuit without using polysilicon.

It is another objective of the invention to provide a method of fabricating resistors in an integrated circuit, whose fabrication process does not require etching, thus allowing the overall process to be simpler and thus easier than the prior art to carry out.

It is still another objective of the invention to provide a method of fabricating resistors in an integrated circuit which can form resistors with large resistance values but without extensive lengths. This will allow the required wafer area for the layout of the resistors to be less than that required for the prior art.

In accordance with the foregoing and other objectives of the invention, a new method of fabricating resistors in integrated circuits is provided.

In a first preferred embodiment, the method of the invention includes the following process steps: preparing a semiconductor substrate; forming a layer of a refractory metal oxide over the substrate; and performing a hydrogen treatment process on a selected part of the refractory metal oxide layer so as to convert the selected part of the refractory metal oxide layer into a conductive oxide of a specific resistive characteristic to serve as the desired resistor.

In a second preferred embodiment, the method of the invention includes the following process steps: preparing a semiconductor substrate; forming a layer of a refractory metal oxide over the substrate; and performing a number of stages of hydrogen treatment successively on a plurality of selected portions of the refractory metal oxide layer where the resistors to be formed in the integrated circuit are defined. The various stages of hydrogen treatment are performed respectively based on a number of predetermined sets of process parameters so as to convert the selected portions of the refractory metal oxide layer into conductive oxides of various resistive characteristics to serve the desired resistors.

BRIEF DESCRIPTION OF DRAWINGS

The invention can be more fully understood by reading the following detailed description of the preferred embodiments, with reference made to the accompanying drawings wherein.

DETAILED DESCRIPTION OF PREFERRED EMBODIMENTS

Before describing the preferred embodiments of the invention, the fundamental principle utilized by the invention for fabricating resistors in integrated circuits will be briefly described first.

Refractory metal oxides, such as $TiO_2$, $Ta_2O$, $FeO_3$, and $BaTiO_3$, are normally insulators with a wide band gap. However, it has been found that these refractory metal oxides can be converted into N-type conductive oxides after being subjected to hydrogen plasma treatment or hydrogen thermal treatment. Through this kind of treatment, hydrogen can be introduced in ion form into the structural gaps or vacancies among the metal atoms in these refractory metal oxides, thereby converting the insulative oxides into either semi-conductive or conductive oxides. The reaction can be formulated as follows:

$$O^{2-} \rightarrow \tfrac{1}{2}O_2 \cdot 2e$$

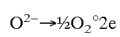

It has also been found that the conductivity of the semiconductive or conductive oxides is dependent on the amount of the oxygen in the oxides. Therefore, it can be concluded that the resistance of the hydrogen-treated oxides can be variably controlled to the desired values by adjusting the process parameters used in the hydrogen plasma treatment or the hydrogen thermal treatment. These process parameters include process time, temperature, and concentration of the hydrogen ions.

Papers that disclose the use of hydrogen treatment to convert refractory metal oxides into conductive oxides include: (1) "SEMICONDUCTOR ELECTRODES FOR PHOTOELECTROLYSIS" presented by Fu-Tai Liou, who is also the inventor of this application, at the State University of New York in 1982 (see particularly page 151); (2) "SOLID ELECTROCHEMICAL MODIFICATION OF SEMICONDUCTORS" presented by C. Y. Yang in Solid State Communication, Vol. 43, No. 8, pp. 633–636 (see particularly page 633); and (3) "Photoelectrolysis at $Fe_2O_3$/ $TiO_2$ Heterojunction Electrode" presented by Fu-Tai Liou et al. in JOURNAL OF THE ELECTROCHEMICAL SOCIETY, Vol. 129, No. 2, pp. 342–345 (see particularly page 342) in February, 1982.

In accordance with the invention, two preferred embodiments are disclosed in the following, with the first preferred embodiment described in reference to FIGS. 1A, 1B, and 1C, and the second preferred embodiment described in reference to FIGS. 2A, 2B, 2C, 2D, and 2E.

First Preferred Embodiment

Figure 1A:
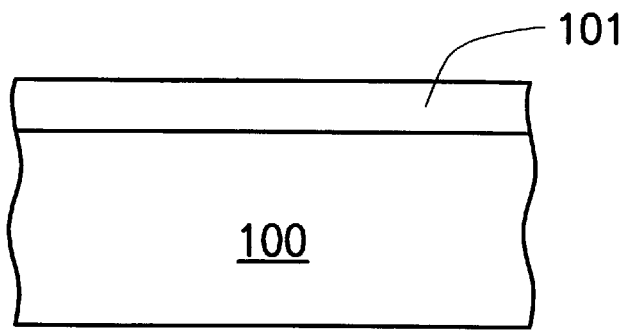
FIGS. 1A, 1B, and 1C are schematic sectional diagrams used to depict the steps involved in a first preferred embodiment of the method for fabricating a resistor in an integrated circuit.
Figure 1B:
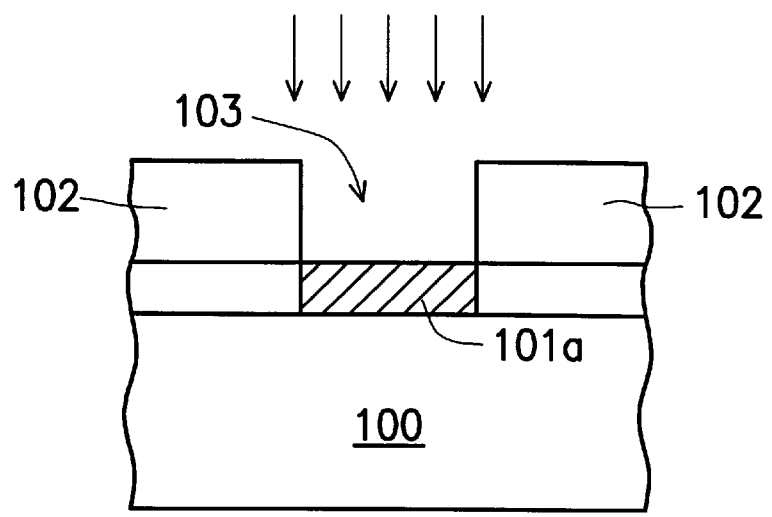
Figure 1C:
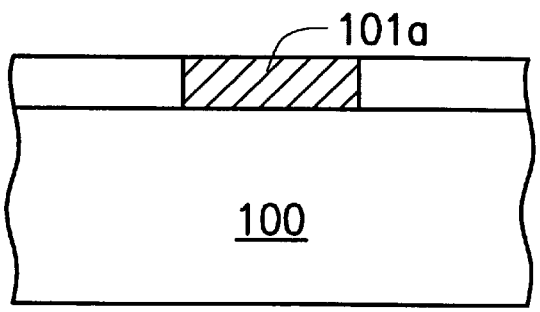

FIGS. 1A, 1B, and 1C are schematic sectional diagrams used to depict the steps involved in the first preferred embodiment of the method of the invention for fabricating resistor in an integrated circuit.

FIG. 1A illustrates the first step, in which a semiconductor substrate 100 is prepared. The substrate 100 can be already formed with various kinds of electronic components (not shown) and isolation structures (not shown), such as MOS transistors and field oxide layers or STI (shallow-trench isolation) structures. The process steps for forming these elements are not within the spirit and scope of the invention, so they are not shown and will not be further described in details in this specification. Broadly speaking, the method of the invention can be used to form a resistor at any location over the substrate 100.

To form a resistor over the substrate 100, the first step is to deposit a layer of a refractory metal oxide 101 over the substrate 100. The refractory metal oxide is selected from the group consisting of $TiO_2$, $Ta_2O_5$, $FeO_3$, and $BaTiO_3$.

Referring next to FIG. 1B, in the subsequent step, a mask layer 102, such as a photoresist layer or a diffusion barrier layer, is formed over the refractory metal oxide layer 101. The mask layer 102 is selectively removed to form a contact hole 103 therein to expose a selected part of the refractory metal oxide layer 101, as the shaded area indicated by the reference numeral 101a in FIG. 1B. Then, with the mask layer 102 serving as a mask, the wafer is subjected to hydrogen plasma treatment or hydrogen thermal treatment. Through this treatment, the unmasked part 101a of the refractory metal oxide layer 101 is converted into a conductive oxide with a specific resistive characteristic (defined in terms of resistance value per unit cross-sectional area).

Referring further to FIG. 1C, in the subsequent step, the entire mask layer 102 is removed. The conductive oxide 101a in the refractory metal oxide layer 101 then serves as the desired resistor.

The resistance of the conductive oxide 101a in the refractory metal oxide layer 101 can be controlled to the desired value simply by forming the contact hole 103 in the step of FIG. 1B with a predetermined size so as to shape the conductive oxide 101a accordingly with a predetermined length to provide the desired resistance value.

Second Preferred Embodiment

FIGS. 2A, 2B, 2C, 2D, and 2E are schematic sectional diagrams used to depict the steps involved in the second preferred embodiment of the method of the invention for fabricating a plurality of resistors in an integrated circuit. In particular, these resistors are to be formed with different resistive characteristics.

Figure 2A:
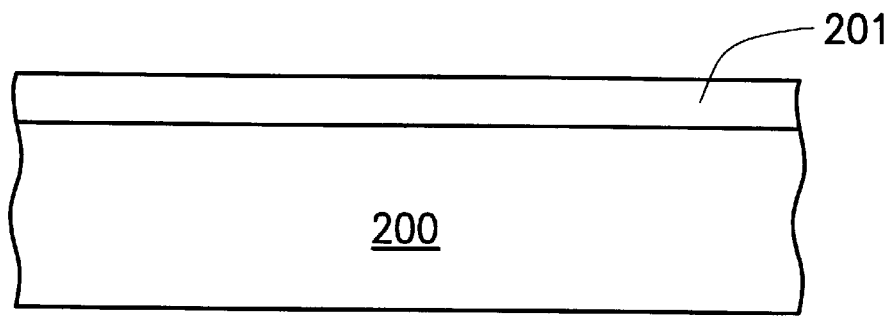
FIGS. 2A, 2B, 2C, 2D, and 2E are schematic sectional diagrams used to depict the steps involved in a second preferred embodiment of the method for fabricating a plurality of resistors of various resistance values in an integrated circuit.

Referring to FIG. 2A, in the initial step, a semiconductor substrate 200 is prepared. The substrate 200 can be already formed with various kinds of electronic components (not shown) and isolation structures (not shown), such as MOS transistors and field oxide layers or STI (shallow-trench isolation) structures. The process steps for forming these elements are not within the spirit and scope of the invention, so they are not shown and will not be further described in details in this specification. Broadly speaking, the method of the invention can be used to form resistors at any locations over the substrate 200.

To form resistors with various resistive characteristics over the substrate 200, the first step is to deposit a layer of a refractory metal oxide 201 over the substrate 200. The refractory metal oxide is selected from the group consisting of $TiO_2$, $Ta_2O_5$, $FeO_3$, and $BaTiO_3$.

Figure 2B:
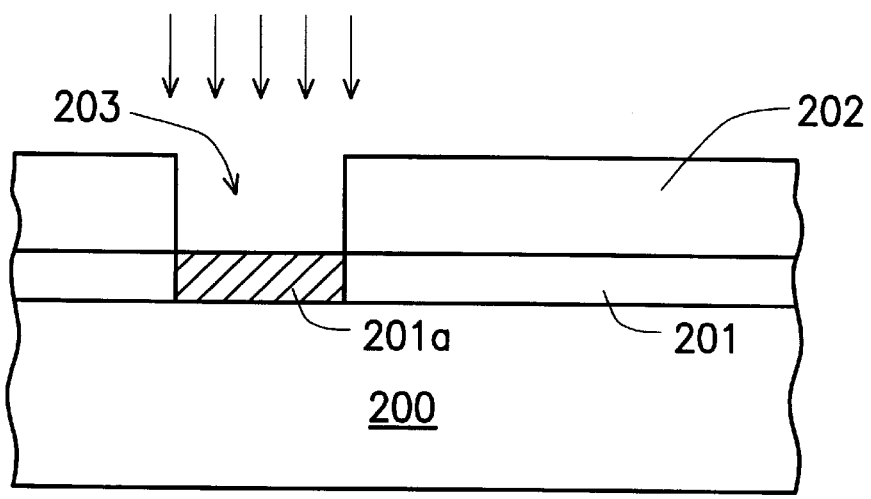

Referring next to FIG. 2B, in the subsequent step, a first mask layer 202, such as a photoresist layer or a diffusion barrier layer, is formed over the refractory metal oxide layer 201. The first mask layer 202 is selectively removed to form a contact hole 203 therein to expose a first selected part of the refractory metal oxide layer 201, as the shaded area indicated by the reference numeral 201a in FIG. 2B. Then, with the mask layer 202 serving as a mask, the wafer is subjected to a first hydrogen treatment process, such as hydrogen plasma treatment or hydrogen thermal treatment, with a first predetermined set of process parameters. Through this process, the unmasked part 201a of the refractory metal oxide layer 201 is converted into a first conductive oxide with a first resistive characteristic.

Figure 2C:
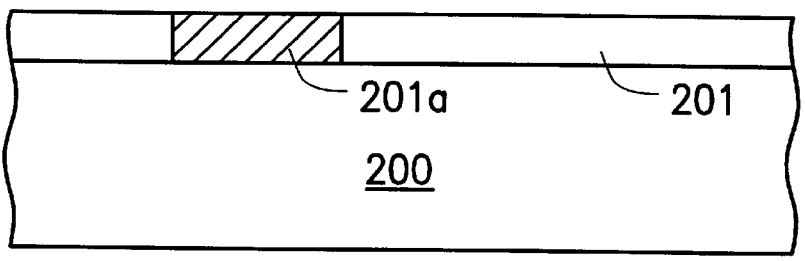

Referring next to FIG. 2C, in the subsequent step, the entire mask layer 202 is removed.

Figure 2D:
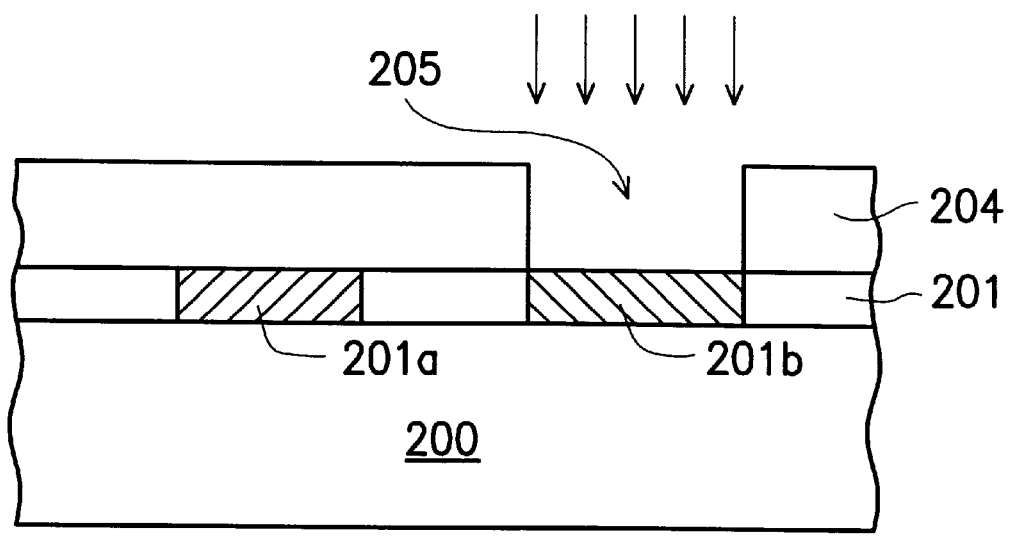

Referring further to FIG. 2D, in the subsequent step, a second mask layer 204, such as a photoresist layer or a diffusion barrier layer, is formed over the refractory metal oxide layer 201. The second mask layer 204 is selectively removed to form a contact hole 205 therein to expose a second selected part of the refractory metal oxide layer 201, as the shaded area indicated by the reference numeral 201b in FIG. 2D. Then, with the mask layer 204 serving as a mask, the wafer is subjected to a second hydrogen treatment process, such as hydrogen plasma treatment or hydrogen thermal treatment, with a second predetermined set of process parameters. The second set of process parameters are different from the first set of process parameters used in the first hydrogen treatment process performed in the step of FIG. 2B so as to allow the resultant conductive oxide to have a different resistive characteristic. Therefore, through the hydrogen treatment process, the unmasked part 201 b of the refractory metal oxide layer 201 is converted into a second conductive oxide with a second resistive characteristic.

Figure 2E:
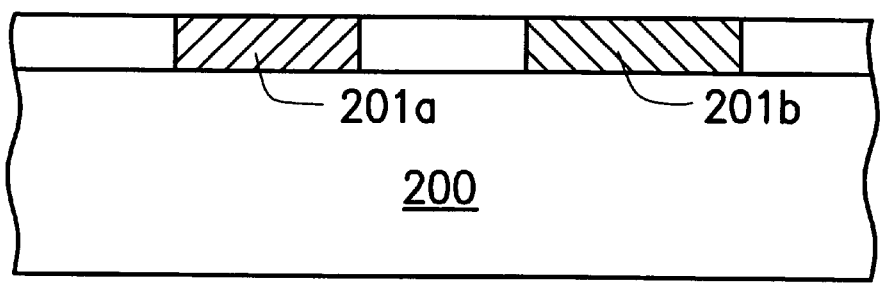

Referring next to FIG. 2E, in the subsequent step, the second mask layer 204 is entirely removed. This completes the fabrication of two resistors, i.e., 201a, 201b, over the substrate 200 with different resistive characteristics, i.e., with different resistance values per unit cross-sectional area.

The resistance of the 201a, 201b can be controlled to the desired value simply by forming the contact holes 203, 205 in the mask layers 202, 204 with predetermined sizes so as to shape these resistors with predetermined lengths to provide the desired resistance values.

The second preferred embodiment disclosed above shows that a number of resistors can be formed over the substrate with different resistive characteristics through a number of stages of hydrogen treatment. These resistors can be controlled to the desired resistance values simply by forming the contact holes in the mask layers with predetermined sizes so as to dimension these resistors with predetermined lengths to provide the desired resistance values. The invention is therefore able to provide resistors of any various resistance values in the integrated circuit.

In conclusion, the method of the invention has the following advantages over the prior art.

(1) First, the method of the invention can be used to form resistors in an integrated circuit with a much wider range of resistance values than the prior art.

(2) Second, the method of the invention can be used to form resistors with different resistance values without having to performing an etching process as in the prior art. The method of the invention is therefore less complex in process steps than the prior art.

(3) Third, the method of the invention allows the resistors to be formed with a large resistance value without having to extending them lengthily over the substrate, thus allowing the use of a reduced layout area in the wafer to save cost. The invention is therefore more cost-effective to implement than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a resistor in an integrated circuit, comprising the steps of:

providing a substrate;

forming a layer of a refractory metal oxide over the substrate; and performing a hydrogen treatment process on a selected part of the refractory metal oxide layer so as to convert the selected part of the refractory metal oxide layer into a conductive oxide with a resistance value per unit cross-sectional area to serves as the desired resistor, wherein the resistor abuts the refractory metal oxide layer.

2. The method of claim 1, wherein the refractory metal oxide is chosen from a group that consists of $TiO_2$, $Ta_2$, $O_5$, $Fe_2O_3$, and $BaTiO_3$.

3. The method of claim 1, wherein the hydrogen treatment process is chosen from a group that consists of a hydrogen plasma treatment process and a hydrogen thermal treatment.

4. The method of claim 1, further comprising:

forming a mask layer over the refractory metal oxide layer prior to performing the hydrogen treatment process; and removing the mask layer after performing the hydrogen treatment process.

5. The method of claim 4, wherein the mask layer is selectively removed to form a contact hole to expose the selected part of the refractory metal oxide layer.

6. The method of claim 4, wherein the mask layer is a photoresist layer.

7. The method of claim 4, wherein the mask layer is a diffusion barrier layer.

8. A method for fabricating a plurality of resistors of various resistance values in an integrated circuit, comprising the steps of:

providing a substrate;

forming a layer of a refractory metal oxide over the substrate;

performing a first hydrogen treatment process, based on a first set of process parameters, on a first selected part of the refractory metal oxide layer so as to convert the first selected part of the refractory metal oxide layer into a first conductive oxide with a first resistance value per unit cross-sectional area to serve as a first resistor; and performing a second hydrogen treatment process based on a second set of process parameters on a second selected part of the refractory metal oxide layer so as to convert the second selected part of the refractory metal oxide layer into a second conductive oxide with a second resistance value per unit cross-sectional area to serve as a second resistor, wherein the first resistor and the second resistor are separated by the original refractory metal oxide layer.

9. The method of claim 8, wherein the refractory metal oxide is chosen from a group that consists of $TiO_2$, $Ta_2O_5$, $Fe_2O_5$, and $BaTiO_3$.

10. The method of claim 8, further comprising the steps of:

forming a first mask layer over the refractory metal oxide layer prior to the step of performing the first hydrogen treatment process,; and removing the first mask layer after the step of performing the first hydrogen treatment process.

11. The method of claim 8, further comprising:

forming a first mask layer over the refractory metal oxide layer prior to performing the first hydrogen treatment process; and removing the first mask layer after performing the first hydrogen treatment process.

12. The method of claim 10, wherein the first mask layer is a photoresist layer.

13. The method of claim 10, wherein the first mask layer is a diffusion barrier layer.

14. The method of claim 8, further comprising the steps of:

forming a second mask layer over the refractory metal oxide layer prior to the step of performing the second hydrogen treatment process,; and removing the second mask layer after the step of performing the second hydro-oxygen treatment process,.

15. The method of claim 8, further comprising:

forming a second mask layer over the refractory metal oxide layer prior to performing the second hydrogen treatment process; and removing the second mask layer after performing the second hydrogen treatment process.

16. The method of claim 14, wherein the second mask layer is a photoresist layer.

17. The method of claim 14, wherein the second mask layer is a diffusion barrier layer.

18. A method for fabricating a plurality of resistors of various resistance values in an integrated circuit, comprising the steps of:

preparing a semiconductor substrate;

forming a layer of a refractory metal oxide over the substrate; and performing a number of stages of hydrogen treatment successively on a plurality of selected portions of the refractory metal oxide layer where the resistors to be formed in the integrated circuit are defined, wherein the various stages of hydrogen treatment are performed respectively based on a number of predetermined sets of process parameters so as to convert the selected portions of the refractory metal oxide layer into conductive oxides with various resistive characteristics to serve as the desired resistors.

19. The method of claim 18, wherein the refractory metal oxide is chosen from a group that consists of $TiO_2$, $Ta_2O_5$, $Fe_2O_3$, and $BaTiO_3$.

20. The method of claim 18, wherein the hydrogen treatment process is chosen from a group that consists of a hydrogen plasma treatment process and a hydrogen thermal treatment.

21. The method of claim 8, wherein the hydrogen treatment process is chosen from a group that consists of a hydrogen plasma treatment process and a hydrogen thermal treatment.

* * * * *